United States Patent [19]
Ward

[11] Patent Number: 5,194,817
[45] Date of Patent: Mar. 16, 1993

[54] APPARATUS AND METHOD FOR TESTING INSULATION USING A PULSED RESONANT POWER SUPPLY

[75] Inventor: Barry H. Ward, Lansdale, Pa.

[73] Assignee: James G. Biddle Co., Blue Bell, Pa.

[21] Appl. No.: 732,072

[22] Filed: Jul. 18, 1991

[51] Int. Cl.⁵ .......................................... G01R 27/00
[52] U.S. Cl. .................................. 324/544; 324/652
[58] Field of Search ............... 324/544, 541, 551, 633, 324/557, 652; 340/646, 647

[56] References Cited

U.S. PATENT DOCUMENTS

| | | | |
|---|---|---|---|
| 3,515,986 | 6/1970 | Peschel | 324/54 |
| 3,609,614 | 9/1971 | Schultz | 336/134 |
| 3,761,853 | 9/1973 | Schultz et al. | 336/180 |
| 3,781,667 | 12/1973 | Tuttle | 324/544 |
| 3,842,344 | 10/1974 | Povey | 324/544 |
| 3,968,426 | 6/1976 | Ward et al. | 324/54 |
| 4,825,171 | 4/1989 | Lefeldt | 324/544 |
| 5,075,628 | 12/1991 | Schuster et al. | 324/551 |

FOREIGN PATENT DOCUMENTS

| | | | |
|---|---|---|---|
| 1404986 | 6/1988 | U.S.S.R. | 324/551 |
| 2082784A | 3/1982 | United Kingdom | 324/551 |

OTHER PUBLICATIONS

"An Alternative to DC Testing of Installed Polymeric Power Cables" B. H. Ward and J. P. Steiner, 7th International Symposium on High Voltage Engineering, Aug. 26-30, 1991.

*Primary Examiner*—Jack B. Harvey
*Assistant Examiner*—Maura K. Regan
*Attorney, Agent, or Firm*—Dann, Dorfman, Herrell and Skillman

[57] ABSTRACT

A testing apparatus for testing electrical insulation, such as cable insulation or electrical rotating machinery ground wall insulation, whereby a cyclically variable inductive reactor is connected in series with an ac power source and the test specimen. The inductance of the reactor is continuously varied such that the magnitude of the inductance is a periodic function of time. As a result the voltage applied to the insulation of the test specimen is in the form of modulated line frequency oscillations passing through resonance.

20 Claims, 3 Drawing Sheets

TIME

APPARATUS AND METHOD FOR TESTING INSULATION USING A PULSED RESONANT POWER SUPPLY

BACKGROUND OF THE INVENTION

1. Field of the Invention

The invention relates to a testing method and apparatus for the testing of electrical insulation of electrical power apparatus, especially high and medium voltage cables with extruded polymeric insulation, and large electrical rotating machinery. In particular the invention relates to a method and device known as a Pulsed Resonant Power Supply which produces high voltage modulated line frequency output to the test sample with no dc content. There is no switching involved hence the test source is suitable for use in non-destructive testing, such as for measurement of partial discharges or dissipation factor, as well as for destructive or withstand testing.

2. Description of the Prior Art

Electrical testing of installed high-voltage power cables is generally performed at or prior to the time of installation and periodically after installation as a routine maintenance test. These tests are made to detect defects or deterioration in the cable that could cause problems during service and to verify proper installation.

Electrical maintenance testing of large rotating machinery is generally performed to assess the condition of the winding insulating materials and monitor trends with time.

The test methods used in both cases are either withstand tests (go/no-go testing) or tests used to measure some specific property of the insulation (nondestructive testing). In the case of withstand testing, the voltage to which the insulation is subjected is higher than the maximum working voltage and is generally specified in the pertinent industry standards. Usually, nondestructive testing is performed at voltage levels up to the maximum working voltage.

Tests in both categories can be either ac or dc although ac tests simulate operating conditions more nearly than dc tests and are also capable of revealing more information about the insulation condition. Ac tests permit the measurement of several different parameters that are sensitive to such things as moisture, dirt, insulation delamination and other forms of damage. Testing using an ac power source is therefore the logical choice for diagnostic testing; however, the size and weight of ac test equipment capable of supplying the reactive volt-amperes required to charge the capacitance of a large winding or long length of cable is prohibitive. Even with the availability of ac resonant test equipment and very low frequency (VLF) test equipment, dc equipment is still less bulky and expensive, and has become the preferred test method.

Dc testing, however, is not without its disadvantages, particularly in testing installed power cable. The following problems that are cause for concern have been identified with dc testing of extruded polymeric cables:

a) The dc test is inadequate for determining the ac withstand strength of extruded polymeric cables and their accessories. Certain defects, undetectable with dc, can cause breakdown under ac conditions.

b) The dc test can cause premature service breakdown by accelerating certain deterioration mechanisms that would otherwise prove harmless under ac stress.

c) External flashover on terminations during dc testing causes a travelling wave that can produce a severe over-voltage condition and subsequent insulation damage.

d) The dc test will always result in a space charge remaining in the cable insulation. Upon re-energization with ac, field enhancements occur which can lead to insulation breakdown.

Another major disadvantage with dc when testing any type of insulation is that the voltage distribution is different from that to which the insulation is subjected during normal operation and therefore these tests can never simulate actual operating conditions.

Several testing methods and apparatus have been devised in the relatively recent past in attempts to simulate operating conditions more closely, yet maintain the advantages of the small size and weight of dc apparatus. However, none of the new methods introduced has completely overcome all of the aforementioned disadvantages.

One of the earliest test apparatus of recent prior art was the resonant power supply. Either series or parallel utilizing a variable inductive reactor or a variable frequency voltage source. While producing pure sinusoidal ac and overcoming the high power input requirements of conventional ac equipment, the resonant power supply still exhibits considerable size and weight for convenient portability.

The sinusoidal very low frequency VLF test apparatus was introduced thereafter. This VLF device generates high voltage at a test frequency of usually 0.1 Hz. The VLF techniques produces an acceptable (generally less than 5% distortion) sinusoidal output, albeit at 0.1 Hz, along with a low power input requirement. Even so, the VLF apparatus, although smaller than an equivalent resonant power supply is still bulky and cannot be conveniently transported from site to site.

A modification to the VLF technique was later introduced in an attempt to reduce test apparatus size and weight by making the output waveshape nonsinusoidal. This was done by periodically switching positive and negative polarity dc on to the cable. During the switching process the cable was discharged through a choke before the opposite polarity dc power supply was connected. The result is an essentially square wave output by which the cable was subjected to opposite polarity dc every 5 seconds. This system still maintains some of the disadvantages of dc such as a gradual trapped space charge build up in the cable and a voltage distribution that does not simulate actual operating conditions. Furthermore the test voltage level for withstand testing, according to some industry standards, is still required to be several times greater than the maximum operating voltage, thus subjecting the cable and accessories to possible damage from travelling waves caused by external flashover.

The most recent prior art test method to be introduced is known as the oscillating wave method. The simplest and most efficient circuit for producing the oscillating wave comprises use of a dc power supply which charges the cable under test, together with a switch, which when closed, discharges the cable through an inductor.

There are other circuits which have been proposed in an attempt to avoid potential problems arising from dc polarization of the cable during the initial charging time. However, complications in voltage control, equipment complexity, and poor circuit efficiency have made the use of these circuits impractical. The oscillating wave variable parameters are frequency and damping rate of the oscillations, and charging time (polarization time) of the cable under test. These parameters are usually not under the control of the operator and thus characterization of the output waveshape is extremely complicated. Thus, although the size and weight of apparatus embodying such other circuits might be acceptable for portability, they suffer from the following disadvantages:

a) The large dc content of the waveform, which could result in a high trapped space charge.
b) Wave shape dependance on the length and capacitance of the cable under test.
c) Difficulty in adapting such a power supply as a partial discharge test source due to the large switching transients involved.

SUMMARY OF THE INVENTION

It is an objective of the invention to provide a simple technique that overcomes all previous objections to dc testing and many of the disadvantages, such as size and weight, of the already identified alternatives. The new test equipment, called a Pulsed Resonant Power Supply (PRPS) is considerably smaller than an equivalent rated resonant or VLF test set and is ideally suited as a voltage source for dissipation factor and partial discharge measurements. The output of the PRPS, which is the test voltage applied to the apparatus under test, appears as the two outside envelopes of the line frequency oscillations depicted in FIG. 2 and can be described as low frequency modulated line frequency oscillations. Since these oscillatons are symmetrical, and mutually offsetting, there is no offset of the voltage from zero, and therefore the apparatus under test is not subjected to any dc test voltage.

Specifically the present invention concerns a pulse resonant test apparatus for the testing of electrical insulation of electrical power apparatus. The test apparatus employs a source of ac voltage, a terminal to be connected to a specimen under test, and a time variant inductor connected in series between the source of voltage and the test specimen terminal. The inductance range of the time variant inductor is selected such that with other inductance of the circuit and anticipated capacitance of the test load and such known auxiliary capacitance as may be supplied across the load terminal at the selected frequency of operation, as inductance is varied, the system will pass in and out of resonance. The apparatus may employ a variable voltage supply, a variety of time variant inductor mechanisms and means permitting connection of instrumentation permitting observation of the voltage imposed on the test specimen and its effect upon the specimen and/or permitting coupling back to a circuit breaker interrupting the circuit of the voltage source.

The method of the present invention is one for testing flexible cable insulation. The method first requires connecting the insulation of a cable to a source of voltage, then applying a time variant effect to the voltage source to produce a pulsed resonant voltage without direct current component. The time variant effect is preferably produced through a time variant inductance in series with the source of voltage under test and changing repetitively so that the circuit including the inductance and the cable insulation is moved in and out of resonance in a repetitive periodic manner. Preferably, the voltage of the source of voltage is variable to select a maximum test voltage for the pulsed resonant voltage produced by the resonant circuit. A further step is observing the effect of the pulsed resonant voltage on the cable insulation by measurement of such parameters as partial discharge or dissipation factor. In addition the output voltage is monitored in order to detect an overvoltage condition or a breakdown of the cable under test. A signal is fed back to circuitry connected to a circuit breaker such that in the event of cable failure the circuit breaker opens thereby disconnecting power from the test circuit and terminating the test.

DRAWINGS ILLUSTRATING THE INVENTION

DETAILED DESCRIPTION OF THE INVENTION

Figure 1:
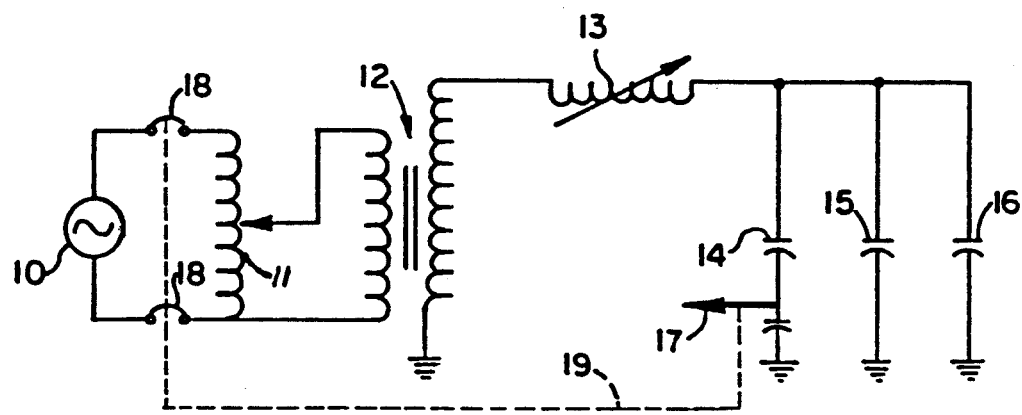
FIG. 1 is a schematic drawing of a typical circuit of the present invention.
Figure 3:
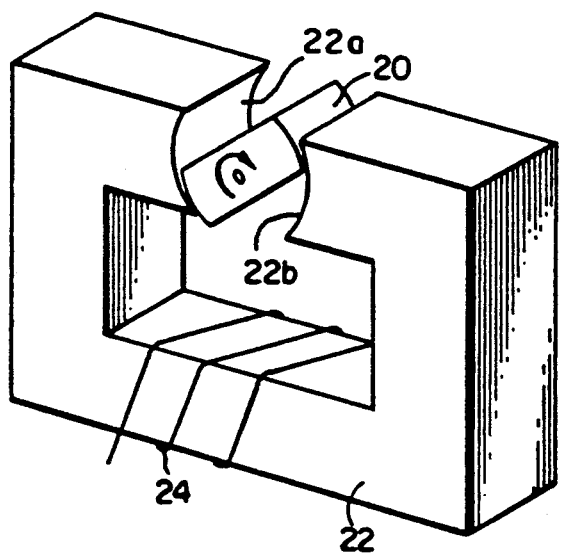
FIG. 3 is a schematic representation of a mechanically operated inductor producing time varying inductances which may be used in the circuit of FIG. 1.
Figure 4:
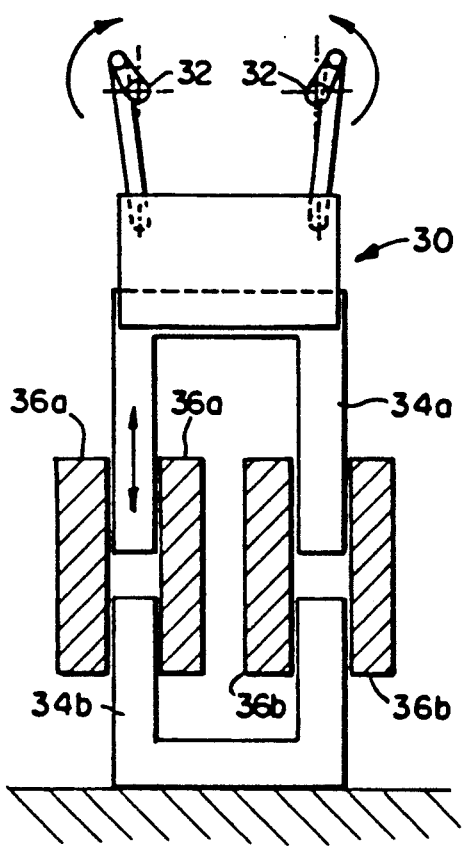
FIG. 4 shows an alternative construction of a mechanically operated inductor for the same purpose.

The typical circuit utilized for the Pulsed Resonant Test is shown in FIG. 1. The principle of operation is that a time variant inductor, for example, as shown schematically in FIGS. 3 or 4, is connected in series with the cable under test such that series resonance is achieved at some point during the periodic variation of the inductance.

Figure 2:
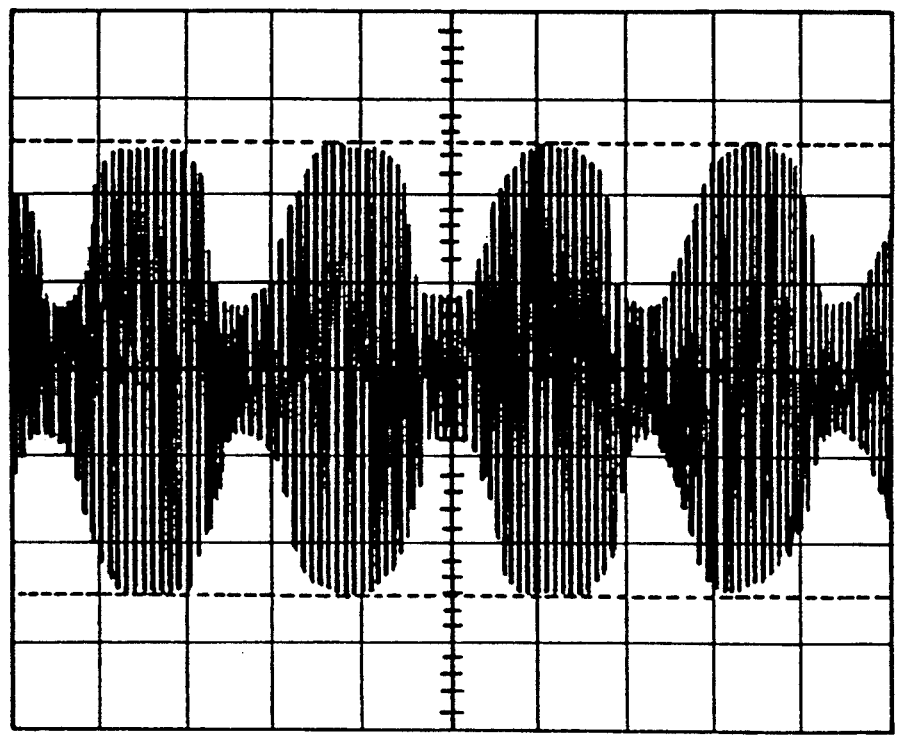
FIG. 2 is a plot of voltage produced in the circuit of FIG. 1 against time.

The circuit will therefore be pulled periodically in and out of series resonance with the result that the voltage impressed across the cable under test will also increase and decrease periodically as shown in FIG. 2.

The advantages of this technique are immediately realized in that during the time that the circuit is in series resonance, the power supply need only supply the losses of the complete system, and the exciter transformer's output voltage is only "1/Q" times the voltage developed across the cable under test. "Q" is the quality factor of the circuit, defined as the ratio of the energy stored in the circuit to the energy dissipated, "Q" is usually in the range of 10 to 40 depending on the cable length. At all other times the series combination of the cable and the inductor present a very high impedance to the power supply and hence the system is running essentially unloaded. Further reductions in the size of the components of the circuit are therefore achieved since the duty cycle of the test is inherently small. Typically the full output of the system is only achieved during 10 to 30 percent of the cycle, depending on the point of tuning. A loading capacitor can be used to optimize the tuning point to that which will give the most favorable "Q" and duty cycle.

The circuit arrangement shown schematically in FIG. 1, represents a pulse resonant test apparatus of the present invention. The ac power source 10 may be a 50 or 60 Hz low voltage mains power supply. Voltage regulator 11 across the output of power supply 10 is used to adjust and control the magnitude of the output voltage. Exciter transformer 12 is used to step up the voltage regulator 11 output voltage. A time variant inductor 13 is connected in series with the secondary of transformer 12 or effectively the extended power supply and the specimen under test 16. A voltage divider 14 used for instrumenting the pulsed resonant power supply (PRPS) and a loading capacitor 15 used only to optimize "Q" and/or duty cycle if desired, are connected in parallel with the specimen under test 16. The loading capacitor 15 and voltage divider 14 can be separate devices as shown or combined as one unit.

For testing according to the circuit arrangement shown in FIG. 1 the procedure is as follows: The voltage regulator 10 is operated such that a low voltage (approximately 5% of desired test voltage) is applied to the specimen under test 16. The time variant inductor 13 is then operated such that its inductance is varied once over its complete range. During the inductance variation of the time variant inductor 13, the magnitude of the output voltage applied to the specimen under test 16, as measured by the instrumentation 17 connected to the voltage divider 14, varies between a minimum and maximum value. The ratio of the maximum value of the output voltage applied to the specimen under test 16, to the output voltage of the voltage regulator 11 is then either computed or measured. From this ratio and the known maximum desired test voltage to be applied to the specimen under test 16, the output voltage of the voltage regulator 11 and thus its positional setting can then be computed. The time variant inductor 13 is then operated in its normal manner such that a continuous cyclical variation of its inductance is achieved. The time to complete one cycle can be varied over a wide range and is set to the desired value. The effect of changing cycle time only influences total test time. The voltage regulator 11 is then operated such that the output test voltage applied to the specimen under test 16 is at the desired test value. Instrumentation 17 is connected to the PRPS such that the effective amount of time during which full test voltage is applied to the specimen under test 16 can be determined.

In an automatic system it is envisioned that the desired test voltage and test time be entered, via, for example, digital selector switches, to the PRPS controller. Once the ratio of the maximum value of the output voltage applied to the specimen under test 16, to the output voltage of the voltage regulator 11 has been computed, the PRPS controller will then set all controls such that the test is run automatically to completion, at which time the voltage regulator 11 is run back to its minimum voltage position and power removed from the PRPS.

All of the components of the PRPS except for the time variant inductor 13, are well known and are commercially available. The time variant inductor, although not a new concept is not commercially available and several new techniques for producing this device are included here as part of this invention.

FIG. 3 shows one such design. The design is similar to that of a reluctance motor, whereby a rotor 20 is positioned between two poles 22a,22b of a stator 22. The stator carries an inductive winding or coil 24 corresponding to variable inductor winding 13 in FIG. 1. In one position of the stator, the stator 22 and rotor 20 form an essentially closed iron path (minimum air gap). In any other position the magnetic circuit comprises the same iron path with the addition of an air gap, the length of which is a function of the angular position of the rotor 20. The inductance of the time variant reactor as seen from the input to the coil 24 will thus vary over a considerable range depending on the ratio of the minimum and maximum effective air gaps. If the rotor 20 is spun at a constant speed, the inductance of the assembly will be a periodic function of time.

Another mechanical structure 30 for producing a time variant inductor is shown in FIG. 4. The design is similar to that of a typical series resonant reactor except that the crank mechanism 32 is designed to provide a reciprocating action of the moveable core portion 34a. The moveable core portion 34a will move toward fixed core portion 34b in a closed or minimum gap position forming a closed or almost closed magnetic path and cycle through to a fully open position providing lowest inductance and then back to the closed position again. The inductance of the time variant reactor as seen from the input to the coils 36a,36b, which may be connected either in series or parallel, will vary over a considerable range depending on the ratio of the minimum and maximum effective air gaps. If the mechanism 32 is driven at constant speed, the inductance of the assembly will be a periodic function of time.

A completely electrical technique by which a time variant inductor can be realized is by periodically varying the average level of flux density in the magnetic circuit which forms the core of the inductor. The average flux density can be made to vary periodically by the application of a periodically varying level of direct current to one or more auxiliary coils coupled into the magnetic circuit, or by the application of a constant amplitude direct current whereby the flux so produced is added to the ac flux during one half cycle of the applied voltage and is subtracted during the other half cycle. In either case the magnetic circuit is arranged such that dc flux is injected into the portion of the magnetic circuit passing through the inductor main coil, but the influence of ac flux generated in the magnetic circuit by the external test circuit is not coupled back into the dc control circuit.

Several methods are possible for achieving the desirable condition of non-feedback of ac influence into the dc circuit.

Figure 5:
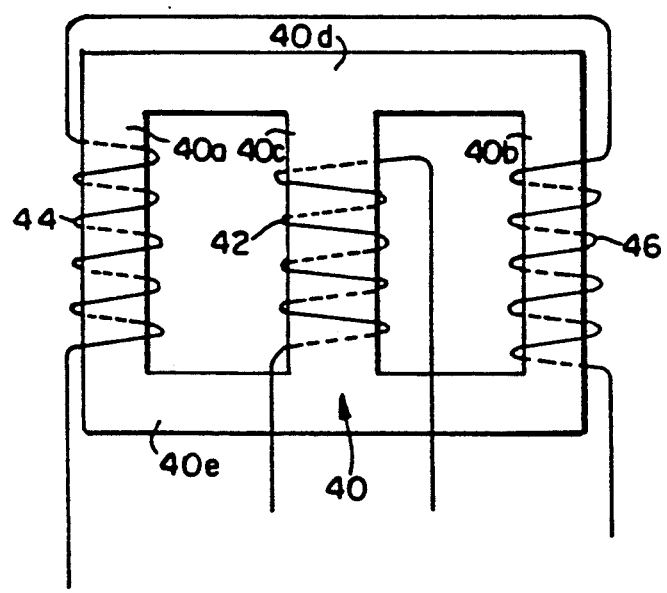
FIG. 5 is a schematic representation of an all electrical alternative varying inductance.

One such method is the use of a saturable reactor type of core configuration, with or without air gaps in the magnetic circuit. FIG. 5 shows one such design. This type of core 40 typically is similar to a single phase transformer shell type core, with two outer legs 40a,40b, a center leg 40c, interconnected by top yoke 40d and a bottom yoke 40e. Typically, a coil 42 is installed on the center leg of the core and is used as the dc control winding. Control is accomplished by varying the amplitude of the dc control voltage applied to the coil 42, thereby varying the level of dc flux injected into the core 40 by the coil 42. The ac coils 44 and 46 are installed on each of the two outer core legs. These two ac coils are typically identical, and are connected such that the ac fluxes generated by them cancel in the center leg, thereby not affecting the dc control circuit. The inductance of this completely electrical time variant inductor, as seen from the input of ac coils 44 and 46 connected in the manner described, will thus vary over a considerable range depending on the level of dc flux injected into the core 40 by the coil 42. If the level of dc control voltage applied to coil 42 is varied from zero to its maximum value and back to zero, continuously, at any desired rate, the inductance of the assembly will be a periodic function of time, the period of which will depend on the rate of change of the dc control voltage. The ac coils 44 and 46 are installed on each of the two outer core legs. These two ac coils are typically identical, and are connected such that the ac fluxes generated by them cancel in the center leg, thereby not influencing the dc supply circuit.

An alternative method is to use the dc flux to vary the level of magnetic saturation in a smaller core which forms part of the main core through the ac inductor that is to be made variable. The smaller core for example could replace the rotor 20 of FIG. 3, or it could be placed in any other section of the magnetic circuit, including inside the main ac coil. This smaller core may also involve air gaps, either within itself, and/or between itself and the main core. At full saturation, this smaller core effectively becomes a significant air gap in the larger core, thereby reducing the inductance of the ac coil to its minimum value. At lower levels of dc flux in the smaller core, the effective air gap that it represents in the main core is reduced, so increasing the inductance of the ac coil. At zero dc flux in the smaller core, the effective air gap that it represents in the main core is at a minimum, so the inductance of the ac coil is at its maximum value. The variable dc supply can be generated by any one of many commonly known means, from simple mechanically driven rheostats, to complex electronic microprocessor controlled oscillators or waveform generators.

The test apparatus as described may be used as a test apparatus which may be monitored by a scope or otherwise at the output 17 to produce imaging such as shown in FIG. 2. In the course of the test this same output may be used in the event of failure of the sample 16 to trigger a circuit breaker 18 shown schematically as a switch and indicated as having a linkage 19 back to circuit breaker 18. If destructive or "withstand" tests are not contemplated, it may be possible to do other types of testing or monitoring at output 17 such as detection or measurement of partial discharges, or measurement of dissipation factor, in accordance with the particular type of test desired.

The present invention has been described in terms of a simple preferred embodiment, which is subject to variation. Variations in the type of inductor employed are shown in FIGS. 3, 4 and 5 and still other variations will be understood by those skilled in the art to exist. All such variations and modifications of the invention within the scope of the claims are intended to be within the scope and spirit of the present invention.

I claim:

1. A pulsed resonant test apparatus for the testing of electrical insulation of electrical power apparatus comprising:
   a source of ac voltage;
   a terminal to be connected to a specimen under test; and
   a time variant inductor connected in series between the source of voltage and the test specimen terminal, the inductance of the inductor being selected such that at the selected frequency of operation with anticipated capacitance of the test load and such known auxiliary capacitance as is supplied across the load terminal, as inductance is varied, the system will pass in and out of resonance.

2. The pulsed resonant test apparatus of claim 1 in which an adjustable source of voltage is provided enabling control of the maximum voltage supply.

3. The pulsed resonant test apparatus of claim 1 in which a tapped inductor is employed as the means of supplying a variable source of voltage.

4. The pulsed resonant test apparatus of claim 1 in which the source of voltage is coupled to the variable inductor and specimen terminal by a transformer.

5. The pulsed resonant test apparatus of claim 2 in which the source of voltage is coupled to the variable inductor and specimen terminal by a transformer.

6. The pulsed resonant test apparatus of claim 1 in which the time variant inductor is provided by a device having a variable reluctance iron core.

7. The pulsed resonant test apparatus of claim 6 in which the reluctance of the iron core is varied by means which is mechanically operated.

8. The pulsed resonant test apparatus of claim 7 in which the iron core is provided with a gap with a rotor rotatably supporting a member within the gap to vary the reluctance periodically as the rotor rotates.

9. The pulsed resonant test apparatus of claim 7 in which the mechanically operated element is a movable core piece and a mechanism to move the movable core piece to periodically open and close gaps between core pieces thereby changing the reluctance as the mechanism is operated.

10. The pulsed resonant test apparatus of claim 1 in which the time variant inductor is provided by an entirely electrical device wherein in addition to the output variable inductance winding on an iron core at least one extra winding is provided with current which causes the average flux density in the core to vary periodically.

11. The pulsed resonant test apparatus of claim 10 in which the core consists of a three legged iron core having core yokes connecting together the legs at each end with a winding on one leg for dc and series connected output windings on the other two legs.

12. A pulsed resonant test apparatus of claim 1 in which a capacitive divider in parallel with the test load across the test terminals is provided permitting connection of instrumentation thereby facilitating observation of the pulsed time varying pulsed resonant voltage imposed on the test specimen and its effect upon the specimen and/or permitting coupling to breaker means.

13. The pulsed resonant test apparatus of claim 12 which is used for non-destructive testing by connection of instrumentation for measurement of partial discharges or dissipation factors through the capacitive divider.

14. The pulsed resonant test apparatus of claim 1 in which the capacitive divider coupling is connected back to a circuit breaker in series with the source of ac voltage via detection circuitry such that any signals, with parameters outside predetermined limits, received by the circuitry cause the circuit breaker to operate.

15. The pulsed resonant test apparatus of claim 13 in which instrumentation for observing and controlling tests is connected to the voltage divider.

16. The method of testing flexible cable insulation comprising:
    connecting the insulation of a cable to a source of voltage; and
    applying time variant effect to the voltage source to produce a pulsed resonant voltage without direct current component.

17. The method of claim 16 in which the time variant effect is provided by a time variant inductance in series with the source of voltage and the cable under test and changing the inductance so that the circuit including the inductance and the cable insulation is moved in and out of resonance in a respective periodic manner.

18. The method of claim 17 including the additional step of adjusting the voltage of the source of voltage to select a maximum test voltage for the pulsed resonant voltage produced by the resonant circuit.

19. The method of claim 17 including the additional step of observing the effect of the pulsed resonant voltage on the cable insulation.

20. The method of claim 17 including the step of feeding back voltage in the event of cable failure to terminate the test by opening a circuit breaker in series with the source of voltage.

* * * * *